United States Patent
Deng

(10) Patent No.: US 8,463,132 B2
(45) Date of Patent: Jun. 11, 2013

(54) INTEGRATED LASER AND PHOTODETECTOR CHIP FOR AN OPTICAL SUBASSEMBLY

(75) Inventor: Hongyu Deng, Saratoga, CA (US)

(73) Assignee: Finisar Corporation, Sunnyvale, CA (US)

( * ) Notice: Subject to any disclaimer, the term of this patent is extended or adjusted under 35 U.S.C. 154(b) by 959 days.

(21) Appl. No.: 12/147,852

(22) Filed: Jun. 27, 2008

(65) Prior Publication Data

US 2009/0034982 A1 Feb. 5, 2009

Related U.S. Application Data

(60) Provisional application No. 60/951,338, filed on Jul. 23, 2007.

(51) Int. Cl.
*H04B 10/10* (2006.01)
*H04B 10/24* (2006.01)

(52) U.S. Cl.
USPC .............................................. 398/139; 398/42

(58) Field of Classification Search
USPC ........................................ 398/42, 135–139
See application file for complete search history.

(56) References Cited

U.S. PATENT DOCUMENTS

| | | | |
|---|---|---|---|
| 6,008,917 A * | 12/1999 | Moise et al. | 398/41 |
| 6,721,503 B1 | 4/2004 | Jokerst et al. | |
| 7,127,133 B2 * | 10/2006 | Manderscheid | 385/14 |
| 7,171,081 B1 * | 1/2007 | Ko et al. | 385/39 |
| 7,418,208 B2 | 8/2008 | Weigert | |
| 2003/0138017 A1 * | 7/2003 | Lee et al. | 372/46 |
| 2005/0056862 A1 | 3/2005 | Park | |
| 2006/0067690 A1 | 3/2006 | Tatum et al. | |
| 2006/0077778 A1 | 4/2006 | Tatum et al. | |
| 2007/0058976 A1 | 3/2007 | Tatum et al. | |
| 2007/0177879 A1 | 8/2007 | Hsieh | |
| 2007/0233906 A1 | 10/2007 | Tatum et al. | |
| 2007/0237462 A1 | 10/2007 | Aronson et al. | |
| 2007/0237463 A1 | 10/2007 | Aronson | |
| 2007/0237464 A1 | 10/2007 | Aronson et al. | |
| 2007/0237468 A1 | 10/2007 | Aronson et al. | |
| 2007/0237470 A1 | 10/2007 | Aronson et al. | |
| 2007/0237471 A1 | 10/2007 | Aronson et al. | |
| 2007/0237472 A1 | 10/2007 | Aronson et al. | |

OTHER PUBLICATIONS

U.S. Appl. No. 12/147,953, filed Jun. 27, 2008, Deng, Hongyu.
12147953 Office Action mailed Apr. 8, 2011.

* cited by examiner

*Primary Examiner* — Leslie Pascal
(74) *Attorney, Agent, or Firm* — Maschoff Brennan

(57) ABSTRACT

A semiconductor device with an integrated optical transmitter and optical receiver is disclosed that can be used in an optical subassembly. The device may include a substrate, a first component, an optical filter, and a second component, wherein the first component comprises an optical transmitter and the second component comprises an optical receiver, or vice versa. The first component can be configured to emit (or be sensitive to) a first optical signal having a first wavelength while the second component can be configured to be sensitive to (or emit) a second optical signal having a second wavelength. The optical filter can be configured to allow transmission therethrough of optical signals having the first wavelength while blocking optical signals having the second wavelength.

18 Claims, 3 Drawing Sheets

INTEGRATED LASER AND PHOTODETECTOR CHIP FOR AN OPTICAL SUBASSEMBLY

CROSS-REFERENCE TO RELATED APPLICATIONS

This application claims the benefit of U.S. Provisional Patent Application Ser. No. 60/951,338, filed Jul. 23, 2007 and entitled INTEGRATED LASER AND PHOTODETECTOR CHIP FOR AN OPTICAL SUBASSEMBLY, the contents of which are herein incorporated by reference in their entirety.

BACKGROUND OF THE INVENTION

1. The Field of the Invention

The present invention generally relates to communications modules, such as optical transceiver modules. In particular, embodiments of the present invention relate to an optical device arrangement wherein an optical emitter and detector are integrated on a single chip, thereby reducing the space needed for these components in an optical subassembly.

2. The Relevant Technology

Computing and networking technology has transformed our world. As the amount of information communicated over networks steadily increases, high speed transmission becomes ever more critical. Many high speed data transmission networks rely on communications modules, such as optical transceivers, optical transponders, and similar devices, for facilitating transmission and reception of digital data embodied in the form of optical signals over optical fibers. Optical networks are thus found in a wide variety of high speed applications ranging from modest Local Area Networks ("LANs") to backbones that define a large portion of the infrastructure of the Internet.

Typically, data transmission in such networks is implemented by way of an optical transmitter (also referred to as an "electro-optic transducer"), such as a laser or Light Emitting Diode ("LED"). The electro-optic transducer emits light when current is passed through it, the intensity of the emitted light being a function of the magnitude of the current. Data reception is generally implemented by way of an optical receiver (also referred to as an "optoelectronic transducer"), an example of which is a photodiode. The optoelectronic transducer receives light and generates a current, the magnitude of the generated current being a function of the intensity of the received light.

Various other components are also employed by the optical transceiver to aid in the control of the optical transmit and receive components, as well as the processing of various data and other signals. For example, the optical transmitter is typically housed in a transmitter optical subassembly ("TOSA"), while the optical receiver is housed in a separate receiver optical subassembly ("ROSA"). The transceiver also typically includes a driver (e.g. referred to as a "laser driver" when used to drive a laser signal) configured to control the operation of the optical transmitter in response to various control inputs and an amplifier (e.g. often referred to as a "post-amplifier") configured to amplify the channel-attenuated received signal prior to further processing. A controller circuit (hereinafter referred to as the "controller") controls the operation of the laser driver and post-amplifier.

As optical transmission speed provided by transceivers and other communications modules rises, a recurrent need for a reduction in the space occupied by the optical transmitter and receiver of an optical subassembly is realized. This in turn enables relatively more optical transmitters and receivers to be disposed in a given volume, thereby increasing the overall speed and efficiency of the data transfer system.

The subject matter claimed herein is not limited to embodiments that solve any disadvantages or that operate only in environments such as those described above. Rather, this background is only provided to illustrate one exemplary technology area where some embodiments described herein may be practiced

BRIEF SUMMARY OF THE INVENTION

These and other limitations are overcome by embodiments of the invention which relate to systems and methods for data transfer. More particularly, embodiments of the invention relate to a semiconductor device with an integrated optical transmitter and optical receiver. The use of such a semiconductor device packaged in an optical subassembly or other form within an optical transceiver, active cable, or other environments can enable the simultaneous transfer of multiple optical signals having distinct wavelengths to and from an optical subassembly in which the semiconductor device is implemented.

An example semiconductor device according to embodiments of the invention can include a substrate, a first component atop the substrate, an optical filter atop the first component, and a second component atop the optical filter. The substrate can include a suitable material, such as, but not limited to, GaAs, InP, or the like or any combination thereof. The optical filter can be configured to allow the transmission therethrough of optical signals having a first predetermined range of wavelengths, while blocking the transmission therethrough of optical signals having a second predetermined range of wavelengths. For instance, the first range of wavelengths can include a first wavelength approximately equal to 1490 nm while the second range of wavelengths can include a second wavelength approximately equal to 1310 nm, although this is not required.

The first component can include an optical transmitter, such as a VCSEL laser or other suitable light source, configured to emit a first optical signal having the first wavelength. Accordingly, the optical filter and the second component can be configured to allow the transmission therethrough of the first optical signal emitted by the optical transmitter. In this example, the second component can include an optical receiver, such as a PIN-type photodiode or other suitable receiver, configured to convert a second optical signal having the second wavelength to an electrical signal. Accordingly, the semiconductor device (or an optical subassembly in which the device is implemented) can be configured to simultaneously transmit and receive the first and second optical signals.

Alternately or additionally, the first component can include a photodiode configured to convert a first optical signal having the first wavelength to an electrical signal, while the second component can include an optical transmitter configured to emit a second optical signal having the second wavelength. In this example, the optical filter and optical transmitter can be configured to allow the transmission therethrough of the first optical signal to be received by the optical receiver. Similar to the above example, the semiconductor device (or optical subassembly in which the device is implemented) of this example can be configured to simultaneously transmit and receive the first and second optical signals.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

Figure 1:
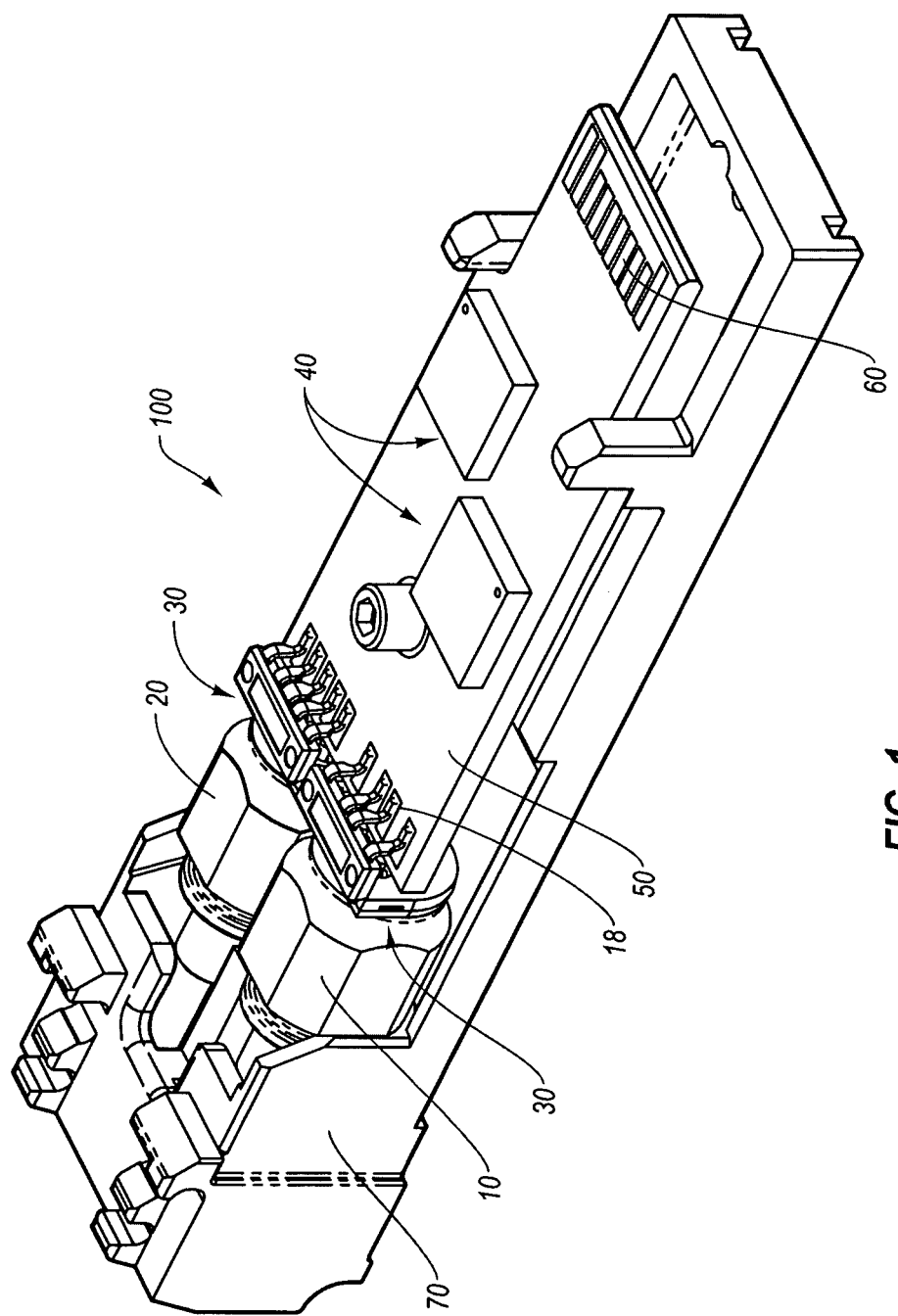
FIG. 1 is a perspective view of a portion of an optical transceiver module that serves as one exemplary environment for practice of embodiments of the present invention.
Figure 2:
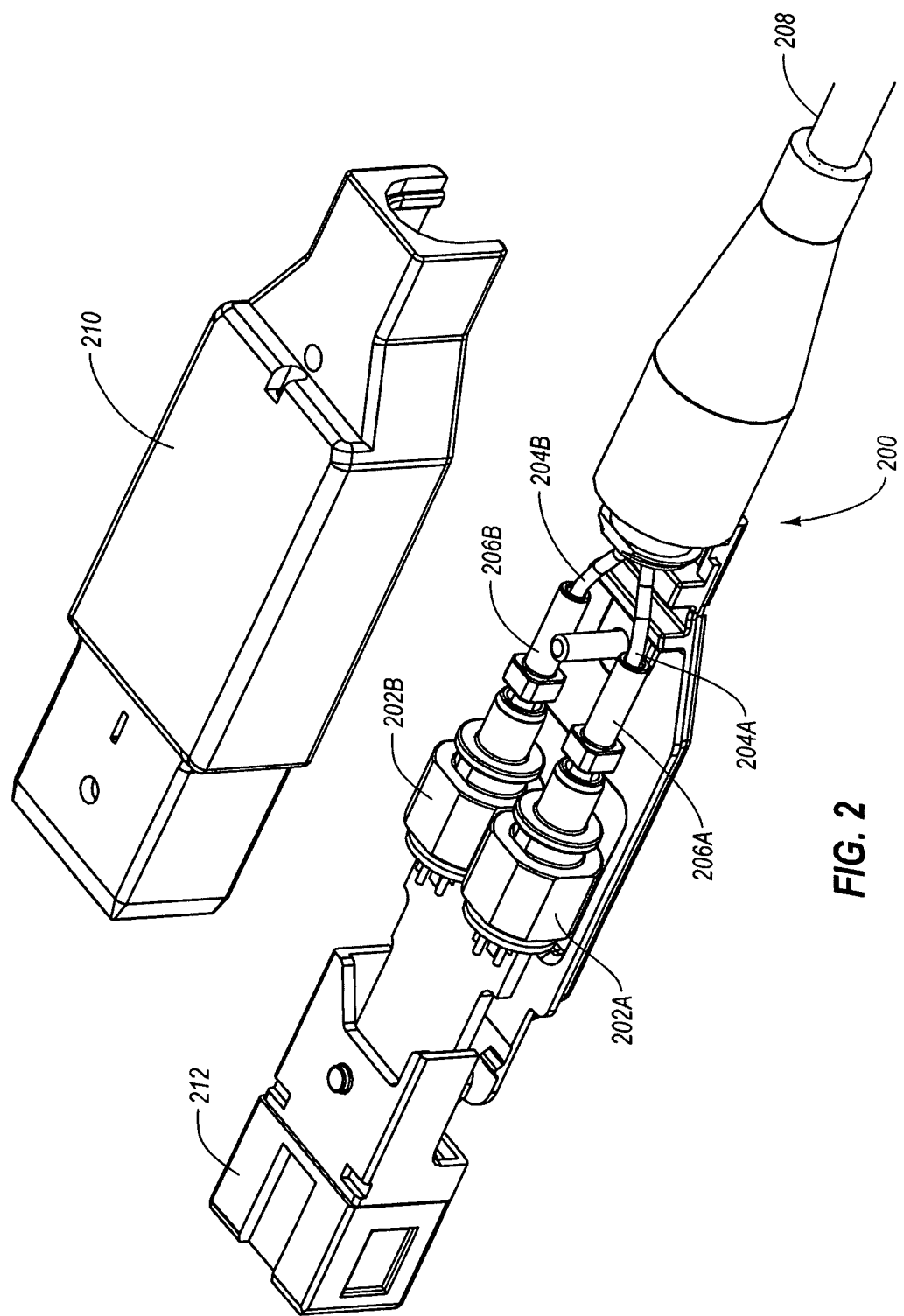
FIG. 2 is a perspective, partially exploded view of an active cable optical transceiver assembly that serves as yet another exemplary environment in which embodiments of the present invention can be practiced.
Figure 3:
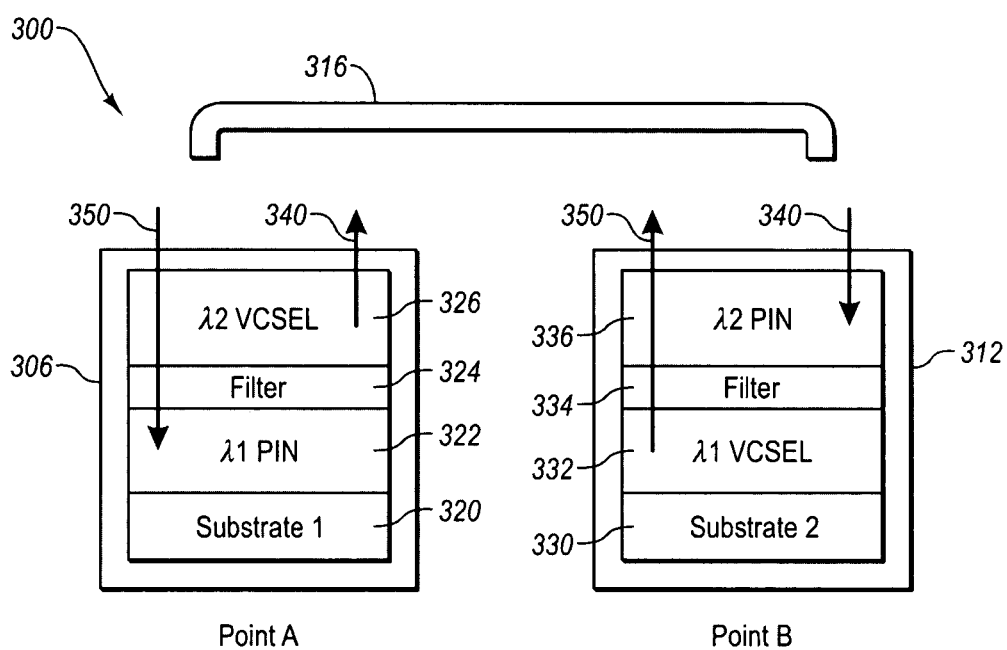
FIG. 3 is a simplified block diagram showing two integrated optical transmitter/receivers included in a communications link according to one example embodiment of the present invention.

FIGS. 1-3 depict various embodiments of the present invention, which is generally directed to an optical transmitter and receiver integrated into a single chip, thereby saving space and increasing device density within an optical subassembly, for instance.

Note at the outset that the discussion to follow regarding embodiments of the present invention should not be construed as limiting the application to such embodiments. Indeed, devices and components apart from optical subassemblies and optical transceiver modules that employ laser devices and photodetectors can also benefit from the teachings to be discussed herein.

1. Example Operating Environments

Reference is first made to FIG. 1, which depicts a perspective view of an optical transceiver module ("transceiver"), generally designated at 100, for use in transmitting and receiving optical signals in connection with an external host that is operatively connected in one embodiment to a communications network (not shown). As depicted, the transceiver shown in FIG. 1 includes various components, including a first optical subassembly ("OSA") 10, a second OSA 20, electrical interfaces 30, various electronic components 40, and a printed circuit board ("PCB") 50. In detail, two electrical interfaces 30 are included in the transceiver 100, one each used to electrically connect the OSAs 10 and 20 to a plurality of conductive pads 18 located on the PCB 50. The electronic components 40 are also operably attached to the PCB 50. An edge connector 60 is located on an end of the PCB 50 to enable the transceiver 100 to electrically interface with a host (not shown here). As such, the PCB 50 facilitates electrical communication between the OSAs 10 and 20, and the host. In addition, the above-mentioned components of the transceiver 100 are partially housed within a shell 70. Though not shown, the shell 70 can cooperate with a housing portion to define a covering for the components of the transceiver 100.

While discussed in some detail here, the optical transceiver 100 is described by way of illustration only, and not by way of restricting the scope of the invention. As mentioned above, the optical transceiver 100 in one embodiment is suitable for optical signal transmission and reception at a variety of per-second data rates, including but not limited to 1 Gigabit per second ("1 G"), 2 G, 2.5 G, 4 G, 8 G, 10 G, or higher rates. Furthermore, the principles of the present invention can be implemented in optical transmitters and transceivers of shortwave and longwave optical transmission and any form factor such as XFP, SFP and SFF, without restriction. Furthermore, embodiments of the invention are not limited to an optical transceiver environment at all, but can alternately or additionally be implemented in other environments, such as optical transponder or other environments.

Reference is now made to FIG. 2, which discloses another possible environment wherein embodiments of the invention can be practiced. In detail, FIG. 2 depicts an active cable assembly 200, wherein OSAs 202A and 202B are incorporated into a cable-type configuration, which offers increased flexibility for optical communication implementations. The OSAs 202A, 202B, which each include a female ferrule, are operably connected to ends of optical fibers 204A and 204B, respectively, via male fiber connectors 206A and 206B that are received within the OSA ferrules. The optical fibers 204A and 204B are contained within, and the ends thereof extend from, a cable 208.

The OSAs 202A and 202B can be housed within a housing 210, which can be attached to a terminal end of the cable 208. A connector plug 212 can be included at a terminal end of the active cable assembly 200 and can be configured to be operably received within a receptacle (not shown) of a host system.

It is appreciated that either or both the first and second OSAs 10 and 20 in FIG. 1, as well as either or both of the OSAs 202A and 202B of FIG. 2 can include an integrated transmitter/receiver as will be described below in accordance with embodiments of the present invention. Furthermore, it is appreciated that the example environments 100, 200 can implement more or fewer than the two disclosed OSAs. As such, these OSAs and environments serve as example implementations of embodiments of the present invention. However, it should be appreciated that these implementations are provided by way of example only, and should not be construed to limit the present invention in any way.

Having described two specific environments with respect to FIGS. 1 and 2, it will be understood that these specific environments are only a few of countless architectures in which the principles of the present invention may be employed. For instance, embodiments of an integrated transmitter/receiver can alternately or additionally be implemented in optical transponder environments. As previously stated, however, the principles of the present invention are not intended to be limited to any particular environment.

2. Integrated Optical Transmitter and Receiver

Reference is now made to FIG. 3. In general, the operating environments described above, including the transceiver 100 and the active cable assembly 200, are examples of environments in which one or more optical subassemblies or other structures suitable for housing an integrated optical transmitter and receiver according to principles of the present invention can be employed.

In detail, FIG. 3 abstractly discloses a fiber optic link, generally designated at 300, including an OSA 306 located at point A in the link and an OSA 312 located at point B. Either or both of the OSAs 306, 312 may correspond to one or more of the OSAs disclosed in FIGS. 1 and 2. The two OSAs 306, 312 can be operably interconnected via an optical fiber 316. The fiber 316 in embodiments of the invention can be a multi-mode fiber capable of simultaneously carrying optical signals having respectively differing wavelengths.

Note that the spatial separation of points A and B can be relatively close, such as in the same room—as in the case of a fiber optic link having a length of 10 meters or less—or relatively more remote, as in the case of separations of about 200 meters, including other spatial separations in between these distances as well. Further, it is appreciated that a communications network can include one or many of such OSAs configured as described herein. Also, though shown as operably interacting with one another, the OSAs to be described below can also be configured to communicate with standard OSAs known in the art.

Generally, each OSA 306 and 312 can include both an optical transmitter and optical receiver arranged in a stacked configuration as an integrated semiconductor device, in a space-saving arrangement. Further, the stacked transmitter and receiver device can be configured to allow optical signals to pass through the stack without interference during OSA operation, as will be explained.

In greater detail, the OSA 306 located at point A can include a substrate 320 composed of a suitable material(s), such as GaAs or InP. A PIN-type photodiode ("PD") 322 or other suitable photodetector can be positioned atop the substrate 320 and can be configured for sensitivity in detecting optical signals within a first predetermined range of wavelengths, referred to herein as $\lambda 1$. In the present embodiment, for instance, the PD 322 can be configured for detection of optical signals having a wavelength of approximately 1490 nanometers ("nm") corresponding to the first predetermined wavelength range $\lambda 1$. Note, however, that the PD 322 could be configured so as to be sensitive to various other wavelengths and wavelength ranges.

The PD 322, being disposed on an InP substrate, can include an n-type InP bottom buffer layer, an undoped InGaAsP layer tuned to the desired wavelength, a p-type InP layer, and an InGaAs top contact layer. Note that a PIN PD formed on other substrates, such as a GaAs substrate, can have a similar layer structure, with the layer compositions being adjusted to match the substrate lattice constant.

An optical isolation filter 324 can be positioned atop the PD 322 and can be configured to pass optical signals having a wavelength within a predetermined range of wavelengths, which may correspond to the first predetermined range of wavelengths $\lambda 1$. For instance, the filter 324 can be configured to pass optical signals having wavelengths of at least 1400 nm. Alternately or additionally, the filter can be configured to pass optical signals of other specific wavelengths and wavelength ranges, according to the particular configuration of the PD 322 residing below the filter.

In greater detail, the filter 324 can be a two-way filter configured to block optical signals within a second predetermined range of wavelengths, referred to herein as $\lambda 2$. For instance, $\lambda 2$ may include the 1310 nm wavelength range in the present example. Thus, the filter 324 can block $\lambda 2$ (e.g., 1310 nm in the present example) optical back-emission from the back side of VCSEL 326 so as to prevent back-emission light from reaching the $\lambda 1$ PD 322, in order to prevent the introduction of cross talk between the two optical signal wavelengths $\lambda 1$ and $\lambda 2$. At the same time, the filter 324 can be configured to allow the optical signal having the $\lambda 1$ wavelength (e.g., 1490 nm in the present example) to pass to reach the $\lambda 1$ PIN PD 322.

Atop the filter 324 a laser 326 or other suitable light source can be positioned. As disclosed in FIG. 3, the laser 326 can be a VCSEL, but other laser types could alternatively be used. The laser 326 can be configured to emit optical signals of the second predetermined wavelength or wavelength range $\lambda 2$. In the present embodiment, for instance, the laser 326 can be configured to emit optical signals having a wavelength of approximately 1310 nm. However, other wavelength emission configurations of the laser 326 are also possible.

In the example disclosed in FIG. 3, the laser 326 is a VCSEL, including an active region sandwiched by top and bottom distributed Bragg reflectors ("DBRs"). The active region can include multiple quantum wells of various compositions e.g. InGaAs, InAl, GaAs, InGaAsN, InGaAsNSb, designed to emit light at the desired wavelength $\lambda 2$. The DBRs are typically alternating layers of quarter-wave-thick AlGaAs, InGaAsP, and other materials, designed to have very high reflectivity at the desired wavelength. Of course, other laser and/or VCSEL structural configurations can alternately or additionally be employed.

As indicated by FIG. 3, the laser 326 can also be configured to enable the passage therethrough of optical signals. In the present embodiment, the laser 326 is configured to have a transmittance that allows the passage therethrough of at least optical signals in the first predetermined wavelength range $\lambda 1$ (e.g., in the range of about 1490 nm in the present example) without significant absorption or reflection. In an example embodiment, the laser can be configured to pass all optical signals therethrough. Or, in another example embodiment the laser can be configured to pass optical signals of only a predetermined wavelength range(s), such as wavelength range $\lambda 1$.

FIG. 3 shows that the OSA 312 disposed at point B can include components corresponding to those of the OSA 306, and as such the components can share many similarities to those already described, subject to the differences as described below. Specifically, the OSA 312 can include a substrate 330 composed of GaAs, InP, or other suitable material having a laser 332 disposed thereon. In the present embodiment, the laser 332 can be a VCSEL configured to emit an optical signal having a wavelength within the first predetermined wavelength range $\lambda 1$, which can be approximately 1490 nm in the present example. However, other wavelengths are alternately or additionally possible.

An optical isolation filter 334 can be included atop the laser 332 and can be configured to enable optical signals within a predetermined wavelength range, which may correspond to the first predetermined wavelength range $\lambda 1$, to pass therethrough. For instance, the filter 334 can be configured to pass optical signals having a wavelength of 1400 nm or greater, although this value is given by way of example only. As such, optical signals within the first wavelength range $\lambda 1$ (e.g., 1490 nm in the present example) produced by the VCSEL 332 may be allowed to pass through the filter 334 when produced. At the same time, the two-way filter 334 can prevent any residual light within the second predetermined wavelength range $\lambda 2$ passing through the PD 336 from being transmitted to the laser 332 and causing any noise problems.

A PIN-type PD 336 can be positioned atop the filter 334 of the OSA 312. The PD 336 can be configured so as to be sensitive to optical signals within the second predetermined wavelength range λ2, such as about 1310 nm in the present example. The PD 336, like the laser 326 of the OSA 306, can be further configured with a transmittance that enables the passage of optical signals of other wavelengths (e.g., λ1) to pass therethrough without significant absorption or reflection. For instance, in the present example, optical signals having a 1490 nm wavelength emitted by the laser 332, disposed below the PD 336 as shown in FIG. 3, may be allowed to pass through the PD 336. The PD 336 can have a similar structure as PD 322, but with layer compositions adjusted so as to match the substrate lattice content of the substrate 330 on which the PD 336 is disposed.

Operation of the OSAs 306 and 312 may be such that optical signals of distinct wavelengths can be simultaneously transferred therebetween. Indeed, the present example configuration is such that either or both of the OSAs 306 and 312 can both send and receive optical signals simultaneously, as is explained below.

During operation of the fiber optic link 300, the laser 326 of the OSA 306 at point A can emit an optical signal 340 having a wavelength λ2 of approximately 1310 nm. After emission by the laser 326, the signal 340 can exit the OSA 306 via an optical pathway including standard light conditioning components including an isolator, lens, etc. (not shown). The λ2 signal 340 can then be directed into the fiber 316 and be transmitted therein to the OSA 312, where it can be passed through standard light conditioning components until received by the PD 336 disposed at the top of the stacked components of the OSA 312, from the perspective seen in FIG. 3.

As discussed above, the PD 336 can be configured to receive the λ2 optical signal 340 and convert it to an electrical signal representative of the data encoded in the signal. The electrical signal can then be forwarded to a host system for use.

In an analogous manner, the laser 332 of the OSA 312 at point B can emit an optical signal 350 having a λ1 wavelength of approximately 1490 nm. The λ1 optical signal 350 is emitted from the laser 332 in an upward direction, according to the orientation shown in FIG. 3, so as to pass through the filter 334, which as described can be configured to allow its passage. The λ1 signal 350 can then pass through the PD 336, which can also be configured to enable passage of the signal therethrough, before exiting the OSA 312 along an optical pathway and entering the fiber 316.

The λ1 signal 350 can be transmitted by the fiber 316 to the OSA 306 at point A, where it is received by the OSA via its optical pathway. The λ1 signal 350 can then be incident on the laser 326, which may be transmissive of the λ1 signal so as to enable it to pass through. The λ1 signal 350 can then pass through the filter 324, configured as described to transmit signals having wavelengths of 1400 nm or above. After passage through the filter, the λ1 optical signal 350 can be received by the PD 322, where the λ1 optical signal can be converted into an electrical signal representative of the data encoded in the signal. The electrical signal can then be forwarded to a host system for use.

As mentioned, the above optical signal transmission and reception operations of each OSA 306 and 312 can be performed simultaneously, given that the optical signals have respectively differing wavelengths. As such, it is appreciated that the OSAs could be configured for simultaneous operation with optical signals having other wavelengths than what has been described above. For instance, rather than 1490 nm and 1310 nm, λ1 and λ2 may be approximately equal to 850 nm and 780 nm, 980 nm and 780 nm, 1310 nm and 850 nm, 1310 nm and 980 nm, or the like.

The stacked laser and photodiode chip configuration as described herein can further significantly reduce the cost and complexity of a compact OSA by virtue of the integrated design and structure of the chip. Such compact OSAs may have utility, for instance, in fiber-to-the home ("FTTH") and fiber-to-the wherever ("FTTX") fiber optic applications.

It is noted that, though not explicitly shown, each OSA 306 and 312 can include a lens, an optical isolator, and/or an optical attenuator, each configured so as to acceptably condition the optical signals of both wavelengths used in connection with the OSAs.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical device for transmitting and receiving optical signals over optical media, the optical device comprising a housing having:
   a first optical subassembly comprising:
      a first substrate;
      a first photodiode component disposed atop the first substrate, the first photodiode component configured to convert an optical signal received via the optical media and having the first wavelength;
      a first optical filter disposed atop the first photodiode component, the first optical filter configured to allow the transmission therethrough of optical signals having the first wavelength; and
      a first optical transmitter component disposed atop the first optical filter, wherein the first optical transmitter is configured to emit an optical signal having a second wavelength for transmission along the optical media;
   a second optical subassembly comprising:
      a second substrate separate from the first substrate;
      a second optical transmitter component disposed atop the second substrate, wherein the second optical transmitter is configured to emit an optical signal having the first wavelength for transmission along the optical media;
      a second optical filter disposed atop the second optical transmitter component, the second optical filter configured to allow transmission therethrough of optical signals having the first wavelength; and
      a second photodiode component disposed atop the second optical filter, the second photodiode component configured to convert an optical signal received via the optical media and having the second wavelength.

2. The optical device of claim 1, wherein:
   the first wavelength is approximately equal to 1490 nanometers and the second wavelength is approximately equal to 1310 nanometers; or
   the first wavelength is approximately equal to 850 nanometers and the second wavelength is approximately equal to 780 nanometers.

3. The optical device of claim 1, wherein the first photodiode or second photodiode is a PIN-type photodiode and includes one or more of:
   an n-type bottom buffer layer;
   an undoped layer tuned to the first wavelength for the first photodiode or to the second wavelength for the second photodiode;
   a p-type layer; and
   a top contact layer.

4. The optical device of claim 1, wherein the first optical transmitter or the second optical transmitter is a vertical cavity surface emitting laser and includes:
   a bottom distributed Bragg reflector including alternating layers of quarter-wave-thick semiconductor layers designed to have high reflectivity at: the second wavelength for the first optical transmitter; or the first wavelength for the second optical transmitter;
   an active region including a plurality of quantum wells; and
   a top distributed Bragg reflector including alternating layers of quarter-wave-thick semiconductor layers designed to have high reflectivity at: the second wavelength for the first optical transmitter; or the first wavelength for the second optical transmitter.

5. The optical device of claim 1, wherein the housing of an optical transceiver module has the first optical subassembly adjacent to the second optical subassembly.

6. The optical device of claim 5, comprising:
   the first optical subassembly configured to be coupled to an optical media, the first optical subassembly comprising:
      the first photodiode is configured as a first PIN-type photodiode disposed atop the first substrate, the first PIN-type photodiode configured to convert a first optical signal received via the optical media and having a first wavelength to a first electrical signal; and
      the first optical transmitter is configured as a first VCSEL laser disposed atop the first filter, the first VCSEL laser configured to emit a second optical signal having a second wavelength for transmission along the optical media, the second optical signal being representative of a second electrical signal received from a host;
   the second optical subassembly configured to be coupled to the optical media, the second optical subassembly comprising:
      the second optical transmitter a second VCSEL laser disposed atop the second substrate, the second VCSEL laser configured to emit a first optical signal having a first wavelength for transmission along the optical media, the first optical signal being representative of a first electrical signal received from the host; and
      the second photodiode is configured as a second PIN-type photodiode disposed atop the second optical filter, the second PIN-type photodiode configured to convert the second optical signal received via the optical media and having a second wavelength to a second electrical signal.

7. The optical device of claim 6, further comprising a first female ferrule configured to receive a first male fiber connector attached to the optical media and a second female ferrule configured to receive a second male fiber connector attached to the optical media, the first male fiber connector operably connecting the first optical subassembly to the optical media and the second male fiber connector operably connecting the second optical subassembly to the optical media.

8. The optical device of claim 6, wherein the first and second optical subassembly is implemented in an optical transceiver or an active cable.

9. The optical device of claim 6, wherein the transmittance of the first VCSEL laser allows the first optical signal to pass through the first VCSEL laser without significant absorption or reflection of the first optical signal.

10. The optical device of claim 6, wherein the first filter is configured to block a back emission optical signal having the second wavelength and emitted by the first VCSEL laser so as to prevent the back emission optical signal from reaching the first photodiode.

11. The optical device of claim 1, wherein the second photodiode is further configured with a transmittance that enables passage therethrough of the optical signal having the first wavelength emitted by the first optical transmitter without significant absorption or reflection.

12. The optical integrated device of claim 1, wherein the first optical transmitter is further configured with a transmittance that enables transmission therethrough of the optical signal having the first wavelength from the optical media to the first photodiode without significant absorption or reflection.

13. The optical device of claim 1, wherein the first filter is further configured to prevent the transmission therethrough of optical signals having the second wavelength.

14. The optical device of claim 13, wherein the configuration of the second filter substantially prevents a residual portion of the optical signal not converted by the second photodiode and having the second wavelength from being transmitted to the second optical transmitter; or
   the configuration of the first optical filter substantially prevents an optical signal emitted from the bottom of the first optical transmitter and having the second wavelength from reaching the first photodiode.

15. The optical device of claim 5, wherein the housing of the optical device is configured as an active cable assembly, wherein the first optical subassembly is operably coupled to a first optical fiber and the second optical subassembly is operably coupled to a second optical fiber, the first optical fiber and second optical fiber both extend from a single cable.

16. An optical device for transmitting and receiving optical signals over optical media, the optical device comprising a housing having a first optical subassembly adjacent to a second optical subassembly:
   the first optical subassembly comprising:
      a first substrate;
      a first photodiode component disposed atop the first substrate, the first photodiode component configured to convert an optical signal received via the optical media and having the first wavelength;
      a first optical filter disposed atop the first photodiode component, the first optical filter configured to allow the transmission therethrough of optical signals having the first wavelength; and
      a first optical transmitter component disposed atop the first optical filter, wherein the first optical transmitter is configured to emit an optical signal having a second wavelength for transmission along the optical media;
   the second optical subassembly comprising:
      a second substrate;
      a second photodiode component disposed atop the second substrate, the second photodiode component configured to convert an optical signal received via the optical media and having the first wavelength;
      a second optical filter disposed atop the second photodiode component, the second optical filter configured to allow the transmission therethrough of optical signals having the first wavelength; and
      a second optical transmitter component disposed atop the second optical filter, wherein the second optical transmitter is configured to emit an optical signal having a second wavelength for transmission along the optical media.

17. The optical device of claim 16, wherein the first and second photodiodes are PIN-type photodiodes.

18. The optical device of claim 16, further comprising a first female ferrule configured to receive a first male fiber connector attached to the optical media and a second female ferrule configured to receive a second male fiber connector attached to the optical media, the first male fiber connector operably connecting the first optical subassembly to the optical media and the second male fiber connector operably connecting the second optical subassembly to the optical media.

* * * * *